United States Patent [19]

Jeng et al.

[11] Patent Number: 5,895,239
[45] Date of Patent: Apr. 20, 1999

[54] METHOD FOR FABRICATING DYNAMIC RANDOM ACCESS MEMORY (DRAM) BY SIMULTANEOUS FORMATION OF TUNGSTEN BIT LINES AND TUNGSTEN LANDING PLUG CONTACTS

[75] Inventors: Erik S. Jeng, Hsinchu; Hung-Yi Luo, Taipei, both of Taiwan

[73] Assignee: Vanguard International Semiconductor Corporation, Hsin-Chu, Taiwan

[21] Appl. No.: 09/152,313

[22] Filed: Sep. 14, 1998

[51] Int. Cl.⁶ .................................... H01L 21/8242
[52] U.S. Cl. ............................... 438/239; 438/254
[58] Field of Search ........................ 438/238, 239, 438/253–256, 381, 396–399

[56] References Cited

U.S. PATENT DOCUMENTS

| | | | |
|---|---|---|---|
| 4,822,753 | 4/1989 | Pintchovski et al. | 437/192 |
| 5,045,899 | 9/1991 | Arimoto | 357/23.6 |
| 5,250,467 | 10/1993 | Somekh et al. | 437/192 |
| 5,281,549 | 1/1994 | Fazan et al. | 437/52 |
| 5,332,685 | 7/1994 | Park et al. | 437/52 |
| 5,700,731 | 12/1997 | Lin et al. | 438/381 |
| 5,710,073 | 1/1998 | Jeng et al. | 438/239 |

*Primary Examiner*—Joni Chang
*Attorney, Agent, or Firm*—George O. Saile; Stephen B. Ackerman

[57] ABSTRACT

DRAM cells having self-aligned node-contacts-to-bit lines with tungsten landing plug contacts for reduced aspect ratio contact openings and via holes is achieved. A planar insulating layer is formed, and openings for bit line contacts, node contacts, and landing plugs on the chip periphery are concurrently etched. A W/TiN layer is patterned to form bit lines, capacitor node, and multilevel contact landing plugs on the DRAM chip. The landing plugs reduce the aspect ratio of the openings for the multilevel contacts. Bit line sidewall spacers are formed, and a BPSG is deposited and planarized. Capacitor openings are etched in the BPSG aligned over the node contacts. A conformal conducting layer is deposited, and a polymer is deposited and planarized. The polymer and the conducting layer are polished back to complete the capacitor bottom electrodes in the capacitor openings. The polymer is removed. An interelectrode dielectric layer and a conformal conducting layer (top electrode) are deposited and patterned to complete the capacitors. Capacitor openings are filled with a planarized insulator and the interlevel contact openings etched to the landing plugs therein have reduced aspect ratios. W/TiN plugs are formed in the openings, and a metal layer (Ti—TiN/AlCu/TiN) is deposited and patterned to form the first level of metal interconnections.

26 Claims, 13 Drawing Sheets

METHOD FOR FABRICATING DYNAMIC RANDOM ACCESS MEMORY (DRAM) BY SIMULTANEOUS FORMATION OF TUNGSTEN BIT LINES AND TUNGSTEN LANDING PLUG CONTACTS

BACKGROUND OF THE INVENTION (1) Field of the Invention

This invention relates to integrated circuit semiconductor devices, and more particularly to a method for fabricating an array of memory cells for dynamic random access memory devices having tungsten (W) self-aligned capacitor node contacts to tungsten bit lines. The process integration also forms at the same time tungsten landing plug contacts in the peripheral circuits on the DRAM chip. This reduces the aspect ratio for the multilevel contacts and provides one-time formation of the landing plug contacts that minimizes substrate damage that would otherwise occur during multiple etching of the contact openings.

(2) Description of the Prior Art

The number and density of memory cells on the DRAM chip has dramatically increased in recent years. By the year 2000 the number of memory cells on a chip is expected to reach 1 Gigabit. This increase in circuit density has resulted from the downsizing of the individual semiconductor devices (FETs) and the resulting increase in device packing density. The reduction in device size is due in part to advances in high resolution photolithography and directional (anisotropic) plasma etching. In the non-self-aligned process of the prior art, the contact openings for the bit lines are made first, and the bit lines are formed. The openings for the capacitor node contacts are then made and alignment tolerances are required between the bit lines and the node contacts that limit the cell density. That is, without self-alignment techniques, the cell size must be increased in order to allow for the misalignment error between the node contacts and the bit lines. Therefore, it is desirable to have self-aligned bit lines to the capacitor node contacts.

One method for forming self-aligned bit-line-to-capacitor-node contacts is described by Park et al., U.S. Pat. No. 5,332,685, in which bit-line contact openings and node contact openings are etched at the same time. A polysilicon or metal layer is deposited and etched back to fill the openings. After forming the bit lines that are insulated, the capacitor bottom electrodes are formed self-aligned to the bit lines. Another method of forming high-density DRAM circuits is described by Jeng et al., U.S. Pat. N0. 5,510,073, in which the bit-line contacts and the capacitor node contacts are simultaneously etched. A conducting layer having a cap oxide is then patterned to form the bit lines and bit-line contacts, while leaving portions of the conducting layer in the capacitor node contacts. The capacitor bottom electrodes are then formed self-aligned to the bit lines. Another method for making DRAM circuits is described Arimoto, U.S. Pat. No. 5,045,899, with the objective of reducing capacitance between the bit lines and the capacitors, and to reduce inter-bit-line capacitance.

Several methods of making tungsten/titanium nitride (W/TiN) contacts to substrates are also described in the literature. One method of forming W/TiN contacts is described by Pintchovski et al., U.S. Pat. No. 4,822,753, in which a Ti/TiN barrier layer is formed prior to depositing the CVD W layer using tungsten hexafluoride to prevent erosion of the silicon substrate. And another method of making W/TiN contacts is described by Somekh et al., U.S. Pat. No. 5,250,467, which provides a Ti/TiN layer to improve the adhesion when the W plug is formed in a contact opening in an insulator on the silicon substrate.

Another problem associated with fabricating DRAM circuits but not addressed in the prior art, is the need to form reliable contacts or via holes for the multilevel of electrical interconnections. The multilevel metal inter-connect structure must be planar to provide a distortion-free photoresist mask that would otherwise result from a shallow Depth Of Focus (DOF) during optical exposure. The planar surface is also required to reliably pattern the conducting layer by directional (plasma) etching without leaving metal residue that can cause intralevel electrical shorts. However, the reduction in critical dimensions (CD) and planar surface result in the need to etch high-aspect-ratio contact openings (or via holes) of varying depths in the interlevel dielectric (ILD) layers, which is not addressed in the current technology.

Therefore there is still a need in the industry to provide a process that forms both self-aligned node contacts to bit lines for DRAM devices while reducing the high aspect ratio of the contact or via holes in the ILD.

SUMMARY OF THE INVENTION

It is a principal object of the present invention to form an array of closely spaced dynamic random access memory (DRAM) cells having capacitor-over-bit line (COB) structures with tungsten (W) node contacts self-aligned to W bit lines to eliminate misalignment and to relax the requirements for critical dimensions (CD).

It is another object of the present invention to form these self-aligned node-contact-to-bit-line structures while reducing the aspect ratio of the multilevel contacts in the peripheral areas of the DRAM chip.

Still another object of this invention is to form concurrently the bit lines and capacitor landing plug contacts using a single contact-opening etch to minimize substrate damage.

It is another object of this invention to replace the conventional polysilicon plug process with a W plug process to minimize junction leakage currents.

In this invention a method is described for making an array of dynamic random access memory (DRAM) cells having capacitor node contacts self-aligned to bit lines, while providing multilevel contact openings with reduced aspect ratios on the periphery of the DRAM chip. The method begins by providing a semiconductor substrate. Typically the substrate is a P$^-$ doped single-crystal silicon having a <100> crystallographic orientation. A relatively thick Field OXide (FOX) that surrounds and electrically isolates device areas in and on the substrate for the DRAM memory cells and for peripheral devices. One conventional method of forming the field oxide areas is by a shallow trench isolation (STI) method, as commonly practiced in the industry. The FETs are formed next by growing a thin gate oxide on the device areas, and then depositing a heavily N$^+$ doped first polysilicon layer and a refractory metal silicide layer (polycide), and a silicon oxide/silicon nitride layer is deposited thereon, and this multilayer is then patterned to form the gate electrodes, having a cap oxide, on the device areas, and concurrently to form word lines over the field oxide areas. For sub-micron FET structures, lightly doped source/drain areas and insulating sidewall spacers are included to improve the device characteristics (short-channel effects). Source/drain contact areas are now formed by ion implanting an N type dopant, such as phosphorus ions (P$^{31}$), adjacent to the sidewall spacers on the FET gate electrodes. This completes the array of FETs used to form the array of switching transistors in the DRAM cells. By including both P and N wells in the silicon substrate, both N-channel and P-channel FETs are formed to provide Complementary Metal Oxide Semiconductor (CMOS) circuits in and on the periphery of the DRAM chip.

The method for making the self-aligned tungsten (W) bit lines and W landing plug contacts consists of depositing a relatively thin conformal first insulating layer, preferably composed of silicon nitride. A relatively thick second insulating layer, composed of a borophospho-silicate glass (BPSG), is deposited and chemically/mechanically polished to provide a planarized surface. A first photoresist mask and anisotropic etching are used to etch contact openings in the second insulating layer selectively to the first insulating layer over the source/drain contact areas of the memory cells, while the first photoresist mask protects the peripheral device areas from etching. The first insulating layer in the contact openings is removed over the source/drain contact areas by selective etching, and thereby forming concurrently bit line contact openings and capacitor node contact openings self-aligned to the gate electrodes. After removing the first photoresist mask, a second photoresist mask and anisotropic etching are used to etch contact openings in the second and first insulating layers to the substrate surface and to the patterned polycide layer in the peripheral device areas. The second photoresist mask protects the memory cell areas during the etching. The second photoresist mask is removed, and a first conducting layer, composed of a barrier layer of titanium/titanium nitride (Ti/TiN) and a tungsten (W) layer, is deposited on the substrate and in the contact openings. A partial etchback is then used to provide a planar W surface. A third insulating layer, composed of a silicon oxynitride (SiON) or silicon oxide (SiO$_2$) and silicon nitride (Si$_3$N$_4$) is deposited on the first conducting layer. A third photoresist mask and anisotropic etching are used to pattern the third insulating layer and the first conducting layer to form tungsten bit lines over the bit line contacts, and concurrently to leave portions of the first conducting layer in the capacitor node contact openings to form node landing plug contacts, and further forming electrical landing plug contacts to the substrate and to the patterned polycide layer in the peripheral device areas of the chip. Since the bit lines and the capacitor node contacts are formed at the same time and are self-aligned, the photo-lithographic alignment necessary for making separate contact openings is avoided and the critical dimensions (CD) are better controlled. After removing the third photoresist mask, second sidewall spacers are formed on the bit lines by depositing a conformal Si$_3$N$_4$ layer and anisotropically etching back.

The stacked storage capacitors are now formed by depositing a relatively thick fourth insulating layer, composed of SiO$_2$, and a fourth photoresist mask and anisotropic plasma etching are used to form openings for the capacitor bottom electrodes aligned over and to the node landing plugs. The fourth photoresist mask is removed and a conformal second conducting layer, composed of a conductively doped polysilicon, tungsten, or titanium nitride layer, is deposited on the substrate and in the openings for the capacitor bottom electrodes. A polymer is deposited to fill the capacitor openings and to form a planar surface. The polymer is blanket etched back to the second conducting layer on the top surface of the fourth insulating layer, while leaving portions in the capacitor openings to protect the second conducting layer in the openings for the bottom electrodes. The exposed second conducting layer on the top surface of the fourth insulating layer is etched back to complete the array of capacitor bottom electrodes for the DRAM. The polymer is then removed, for example by plasma ashing. A capacitor interelectrode dielectric layer is then formed on the bottom electrodes. A third conducting layer, such as a doped polysilicon, titanium nitride, or the like, is deposited and patterned to form the capacitor top electrodes. A fifth insulating layer is deposited sufficiently thick to fill the capacitor openings and polished back to form a planar surface.

The next level of electrical interconnections is then formed by etching contact openings or via holes in the fifth insulating layer. A fifth photoresist mask and anisotropic plasma etching are used to etch the contact openings to the capacitor top electrodes, while concurrently etching multilevel contact openings in the fifth and fourth insulating layers to the electrical plug contacts (tungsten plugs) on the substrate and to the patterned polycide layer in the peripheral device areas. By the method of this invention, by using the tungsten plugs, the multilevel contact openings etched to the electrical plug contacts result in shallower contact openings and reduced aspect ratios. This improves the reliability of making contacts on high-density circuits having submicron dimensions. To complete the integrated circuit (DRAM) to the first level of electrical interconnections, a fourth conducting layer, such as Ti/TiN and W, is deposited and etched back to form conducting plugs in the multilevel contact openings. A fifth conducting layer, such as Ti—TiN/AlCu/TiN, is deposited and patterned by conventional photolithography and plasma etching to form the next level of electrical interconnections.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

Referencing now to FIGS. 1 through 14 and in keeping with the objects of this invention, a detailed embodiment is described for making memory cells for DRAM devices having tungsten (W) landing plugs for the capacitor node contacts self-aligned to tungsten bit lines, while forming landing plug contacts on the periphery of the DRAM chip to reduce the aspect ratio for the multilevel contacts. Although the process is described for making memory cells for DRAM devices having N-channel FETs as the access transistors, it should also be well understood by one skilled in the art that by including additional process steps, in addition to those described in this embodiment, other types of devices can be included on the DRAM chip. For example, by forming N-well regions in a P$^-$ doped substrate, P-channel FETs can also be provided from which Complementary Metal-Oxide-Semiconductor (CMOS) circuits can be formed, such as are required for the peripheral circuits on the DRAM chip.

Figure 1:
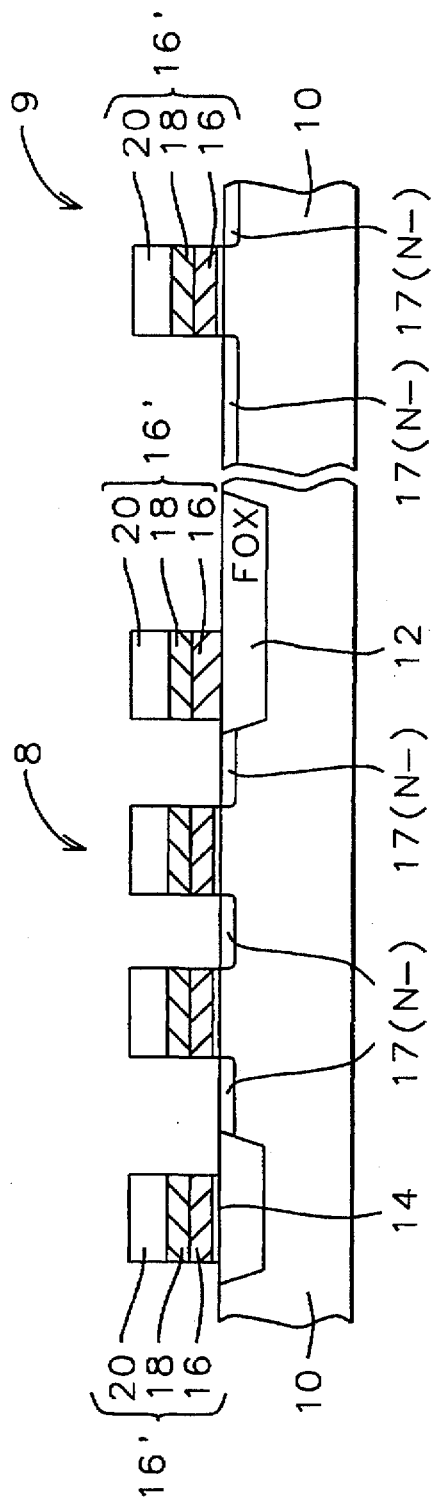
FIGS. 1 through 14 are schematic cross-sectional views showing the sequence of process steps for making the novel self-aligned tungsten capacitor node contacts to bit lines and multilevel contact openings having reduced aspect ratio on the periphery of the DRAM chip.

Referring to FIG. 1, the method begins by providing a semiconductor substrate 10, a portion of which is shown in the FIG. having memory cell regions 8 and peripheral regions 9. Typically the substrate is a P$^-$ doped single-crystal silicon having a <100> crystallographic orientation. Field OXide (FOX) regions 12 are formed surrounding and electrically isolating the device areas. Portions of the FOX 12 are depicted in the FIG. for one of the memory cell areas. One conventional method of forming the field oxide regions is by using a shallow trench isolation (STI) method, as commonly practiced in the industry. Generally the STI is formed by etching trenches in the field oxide regions on the substrate to a depth of between about 2500 and 10000 Angstroms. After forming a thin thermal oxide in the trenches, the trenches are filled with an insulating material such as silicon oxide ($SiO_2$), and are made planar with the surface of the substrate 10, for example, by using a planarizing etchback or chemical/mechanical polishing (CMP). Next, a thin gate oxide 14 of about 20 to 90 Angstroms is grown on the device areas. The FET gate electrodes are then formed by depositing an $N^+$ doped polysilicon layer 16, for example by low pressure chemical vapor deposition (LPCVD), and is typically deposited to a thickness of between about 500 and 1500 Angstroms. A refractory metal silicide layer 18, preferably composed of tungsten silicide ($WSi_2$) is deposited by LPCVD to a thickness of between about 500 and 1500 Angstroms. A cap oxide layer 20, composed of $SiO_2$ with a top $Si_3N_4$ layer, is deposited. Layer 20 is deposited preferably by LPCVD and has a thickness of between about 1000 and 2500 Angstroms. Layers 20, 18, and 16 are patterned using conventional photolithographic techniques and anisotropic plasma etching to form the polycide gate electrodes 16' over the active device areas 8, while forming word lines over the FOX 12, and concurrently forming portions of the FETs in the chip area 9 for the peripheral circuits.

Still referring to FIG. 1, for sub-micron FET structures, it is common practice to include lightly doped source/drain areas 17($N^-$) to improve the device characteristics, such as minimizing short-channel effects. Typically the lightly doped regions are formed by implanting phosphorus ions ($P^{31}$).

Figure 2:
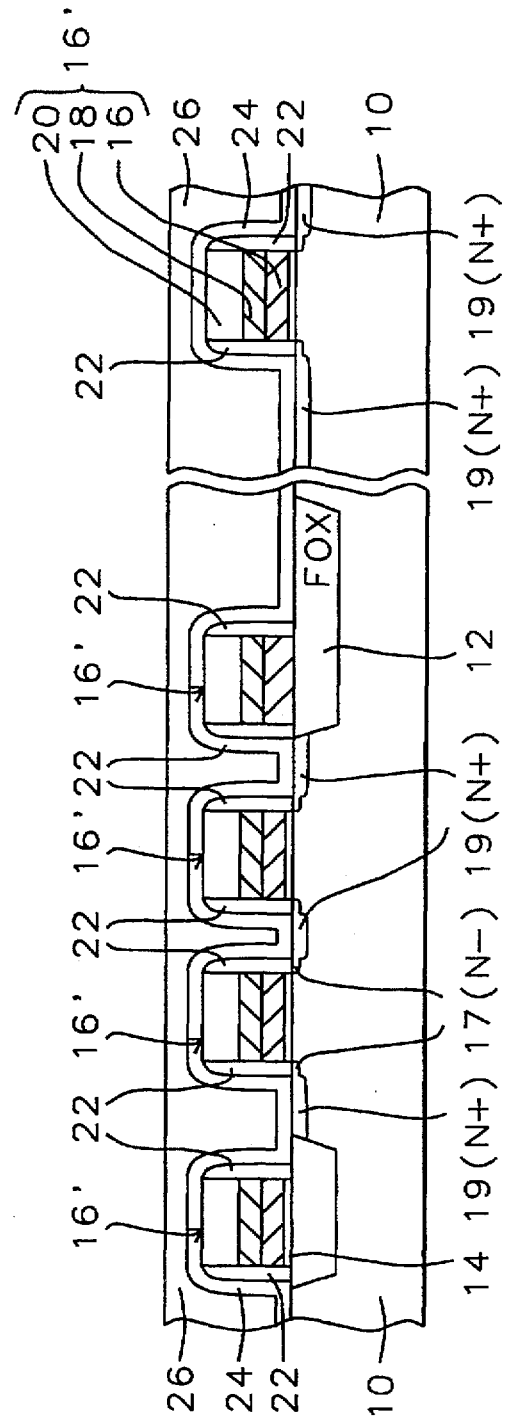

As shown now in FIG. 2, insulating sidewall spacers 22 are formed on the sidewalls of the gate electrodes 16'. The sidewall spacers 22 are formed preferably by depositing a conformal $Si_3N_4$ layer using LPCVD, and anisotropically plasma etching back the $Si_3N_4$ layer. The $Si_3N_4$ is deposited to a preferred thickness of between about 200 and 800 Angstroms prior to etching. Source/drain contact areas 19($N^+$) are now formed by ion implanting an N type dopant, such as $P^{31}$, adjacent to the FET gate electrodes 16' to complete the FETs. The contacts 19($N^+$) are preferably doped to a final concentration of between about 1.0 E 19 and 1.0 E 21 atoms/$cm^3$.

Still referring to FIG. 2, the method for making the self-aligned tungsten (W) bit lines and W landing plug contacts consists of depositing a relatively thin conformal first insulating layer 24, preferably composed of $Si_3N_4$. Layer 24 is deposited by LPCVD using a reactant gas mixture such as dichlorosilane ($SiCl_2H_2$) and ammonia ($NH_3$). Layer 24 is deposited to a preferred thickness of between about 50 and 400 Angstroms. A relatively thick second insulating layer 26 is deposited on the first insulating layer. Layer 26 is composed of a borophosphosilicate glass (BPSG), which can be deposited by LPCVD using tetraethosiloxane (TEOS) as the reactant gas. Boron and phosphorus are added during deposition of the BPSG layer. Layer 26 is then chemically/mechanically polished to provide a planarized surface having a thickness of between about 4500 and 9000 Angstroms over the gate electrodes 16'.

Figure 3:
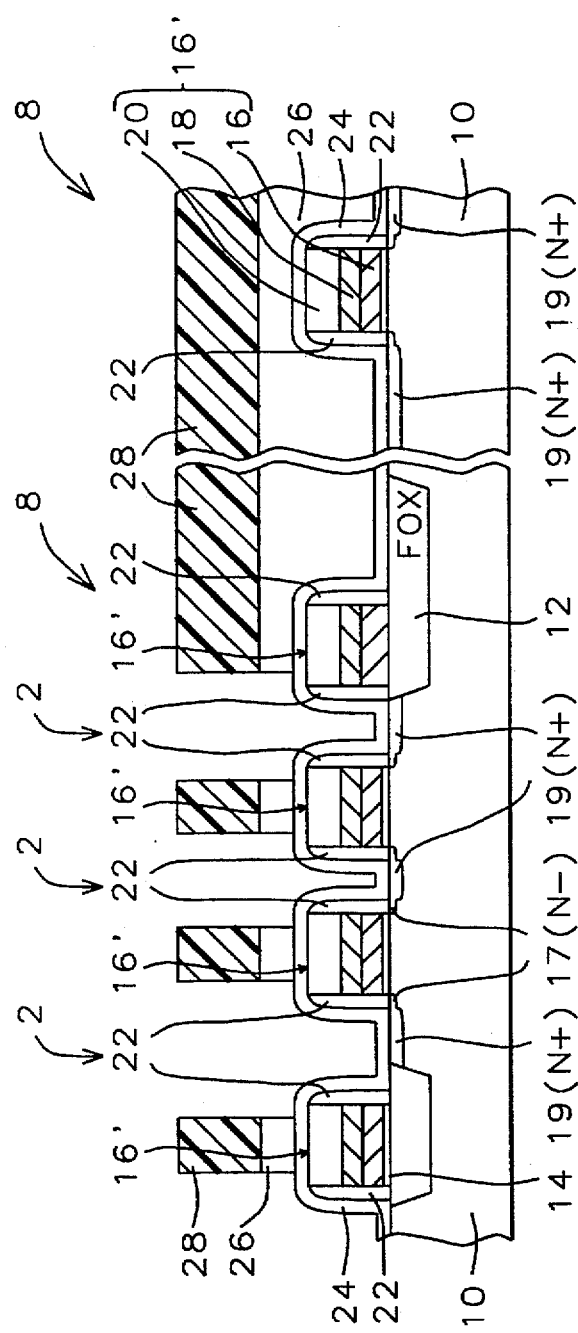

Referring now to FIG. 3, a first photoresist mask 28 and anisotropic etching are used to etch contact openings 2 in the second insulating layer 26 selectively to the first insulating layer 24 over the source/drain contact areas 19($N^+$) in the memory cell area 8, while the first photoresist mask 28 protects the peripheral device areas 9 from being etched. The anisotropic plasma etching etches the BPSG selectively to the underlying $Si_3N_4$ layer 24, having an etch selectivity at least greater than about 20:1. The plasma etching is preferably carried out using reactive ion etching (RIE) and an etchant gas mixture such as perfluoroisobutylene ($C_4F_8$), trifluoromethane ($CHF_3$), methylfluoride ($CH_3F$), carbon tetrafluoride ($CF_4$), carbon monoxide (CO), and argon (Ar) as the carrier gas.

Figure 4:
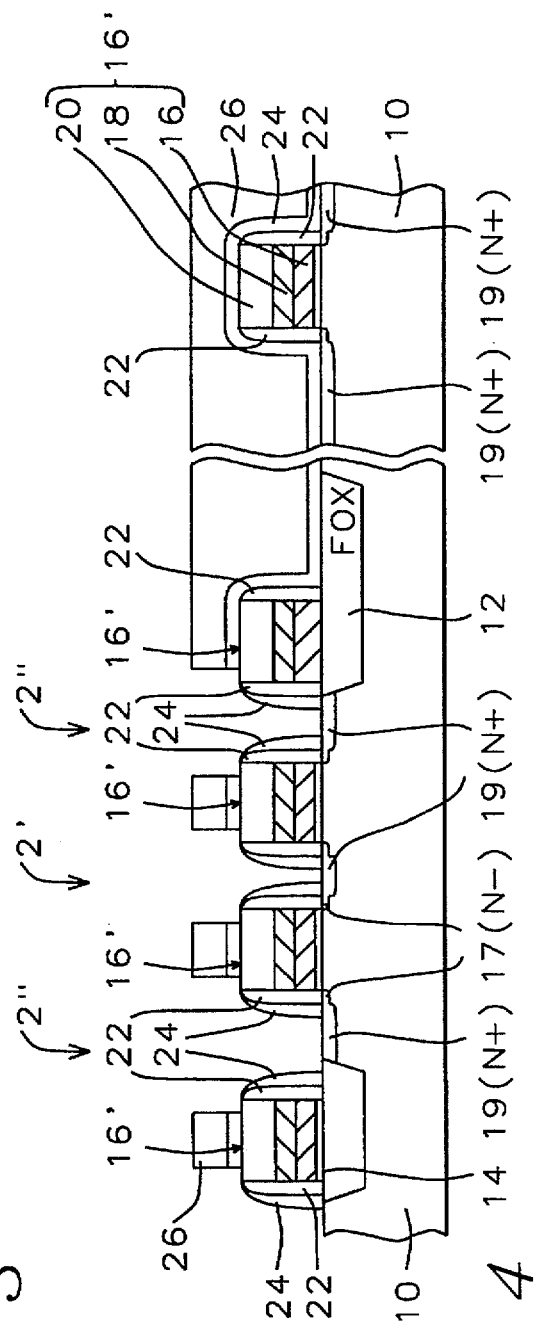

Referring to FIG. 4 and with the first photoresist mask 28 still in place, the $Si_3N_4$ first insulating layer 24 is removed over the source/drain contact areas 19($N^+$) in the exposed contact openings 2. The $Si_3N_4$ layer 24 is selectively etched to the silicon substrate 10 using RIE and an etchant gas mixture composed of $C_4F_8$, $CHF_3$, $CH_3F$, $CF_4$, CO, and Ar as the carrier gas. This results in the contact openings 2 being etched concurrently to the bit line contact openings 2' and capacitor node contact openings 2" self-aligned to the gate electrodes 16', as shown in FIG. 4. The first photoresist mask 28 is then removed, for example by plasma ashing in oxygen ($O_2$).

Figure 5:
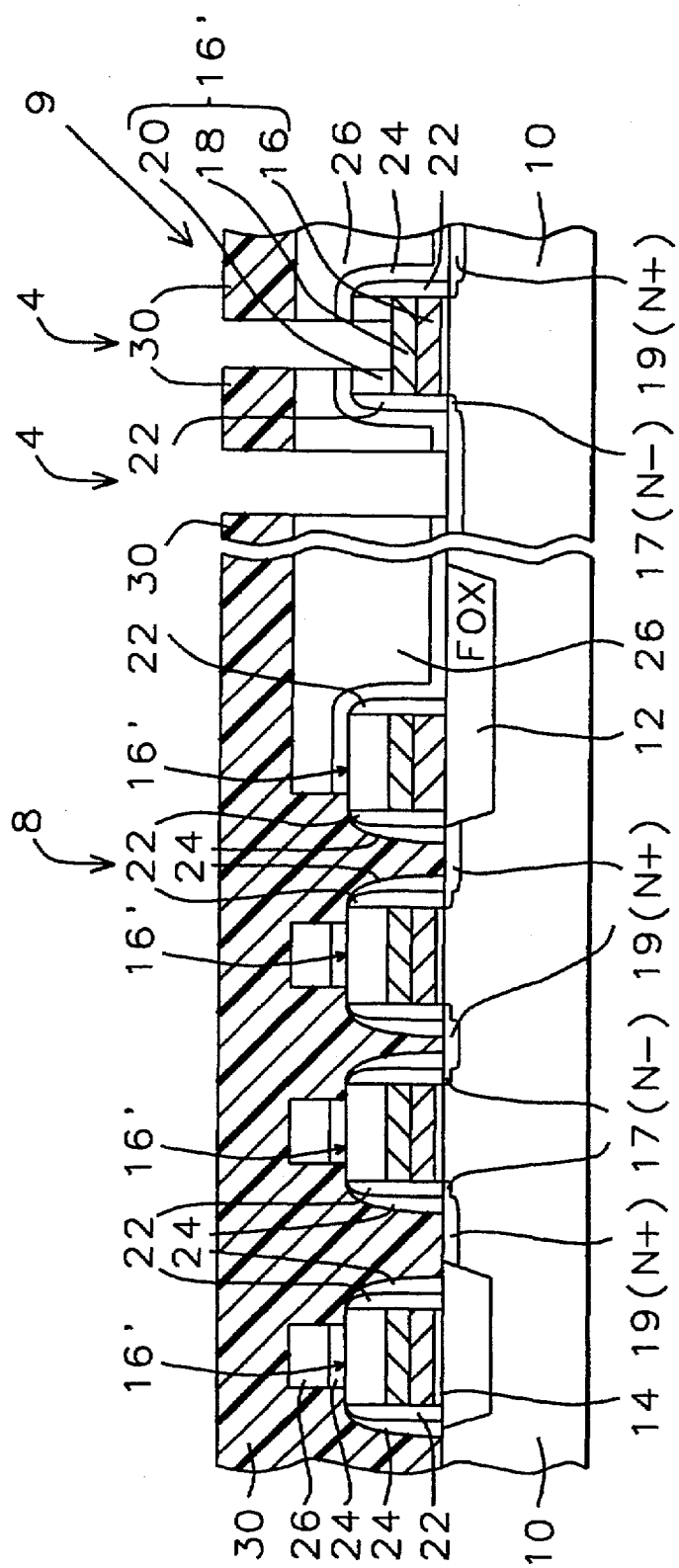

Referring to FIG. 5, after removing the first photoresist mask, a second photoresist mask 30 and anisotropic plasma etching are used to etch contact openings 4 in the second and first insulating layers 26 and 24 to the substrate surface 10 and also through the cap oxide layer 20 to the top surface of the patterned polycide layer 16' in the peripheral device areas 9. The second photoresist mask 30 protects the memory cell areas 8 during the etching. Preferably the anisotropic etching is carried out in a reactive ion etcher having a high etch-rate selectivity of at least 10:1 of $SiO_2$ to the Si substrate 10 and the $WSi_2$ layer 18.

Figure 6:
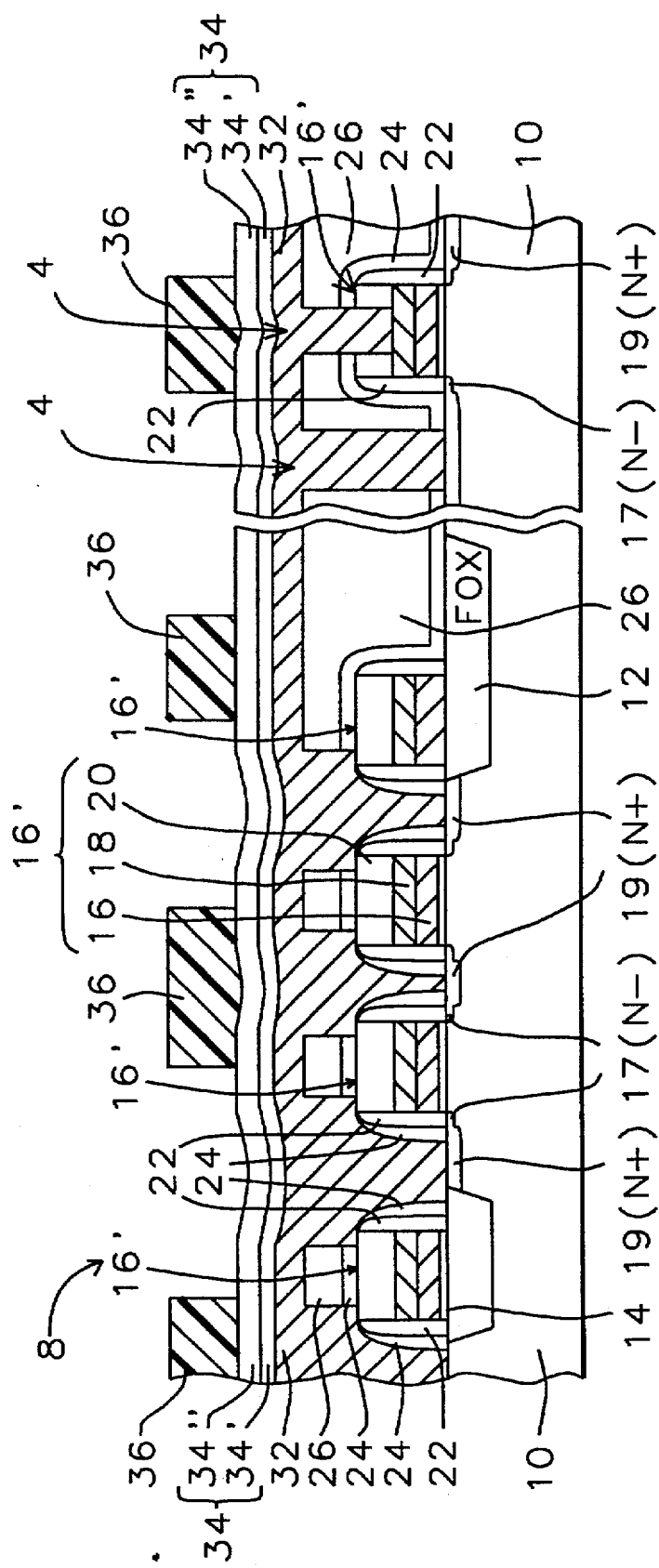

Referring to FIG. 6, after etching the contact openings 4 for the peripheral landing plugs, the second photoresist mask is removed. A first conducting layer 32 is formed by depositing a barrier layer of titanium/titanium nitride (Ti/TiN) followed by a tungsten (W) layer on the substrate and sufficiently thick to fill the contact openings 2', 2" and 4. The barrier layer is deposited by physical vapor deposition (PVD), and more specifically by sputter deposition using a Ti target, and deposited to a thickness of between about 50 and 300 Angstroms, and nitrogen ($N_2$) is introduced during the Ti sputter deposition to form a TiN layer having a thickness of between about 100 and 500 Angstroms. Alternatively, the Ti and the TiN can be deposited by CVD using a reactant gas such as $TiCl_4$ to deposit the Ti, and including ammonia ($NH_3$) to form the TiN. Next, the tungsten layer is formed by CVD using tungsten hexafluoride ($WF_6$) as the reactant gas. The barrier layer and the W layer are depicted as a single layer 32 to simplify the drawings. A partial etch back is then used to planarize the W surface, the W layer having a thickness of between about 500 and 2000 Angstroms over the second insulating layer 26 after planarizing. A third insulating layer 34, composed of a silicon oxynitride (SiON) layer or a silicon oxide ($SiO_2$) layer labeled 34' and a $Si_3N_4$ layer 34", is deposited on the first conducting layer 32. Layer 34' is deposited by LPCVD using TEOS as the reactant gas, and is deposited to a thickness of between about 100 and 1000 Angstroms. Layer 34" is also deposited by LPCVD using $SiCl_2H_2$ and $NH_3$ as the reactant gas, and is deposited to a thickness of between about 500 and 2500 Angstroms. A third photoresist layer is then deposited and patterned to form the photoresist mask 36.

Figure 7:
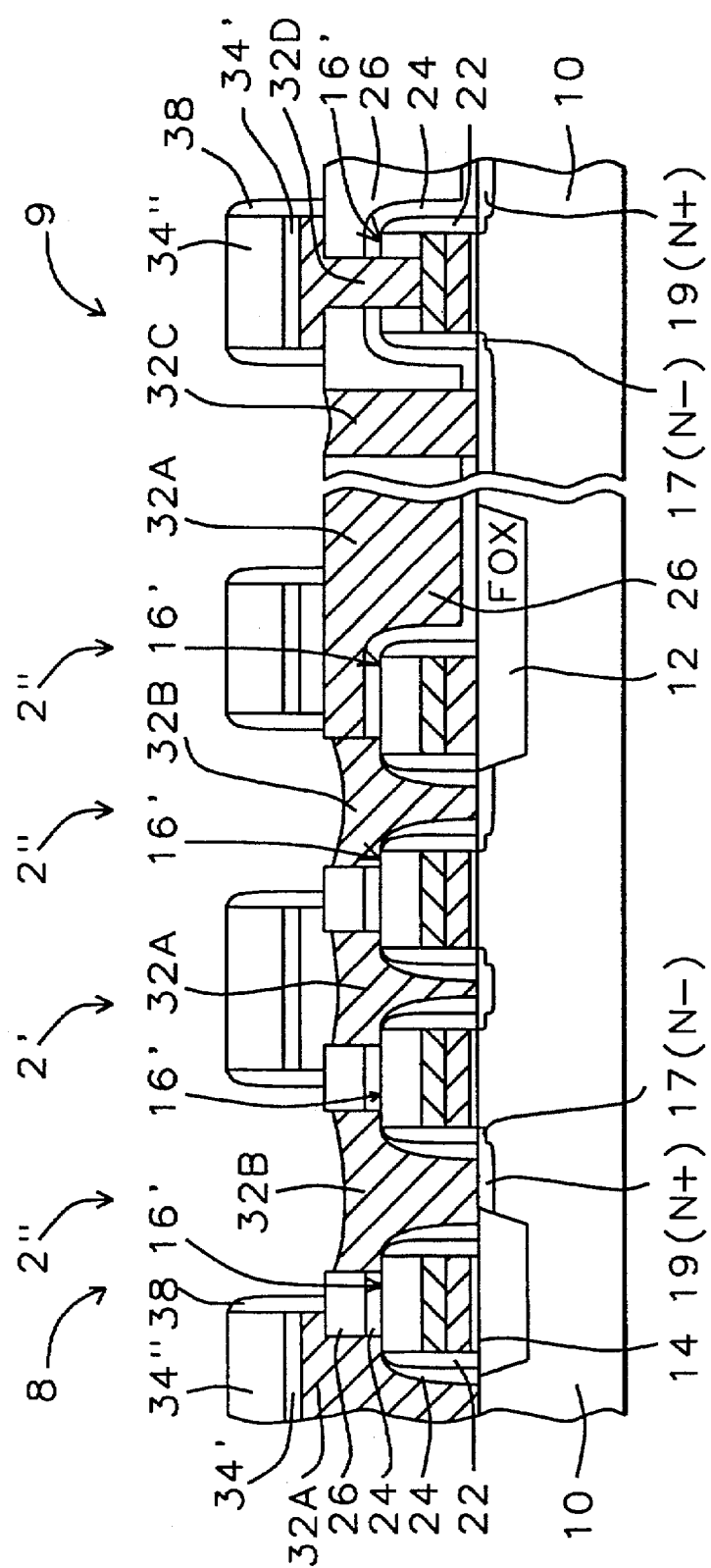

Now referring to FIG. 7, the third photoresist mask 36 and anisotropic etching are used to pattern the third insulating layer 34 and the first conducting layer 32 to form tungsten bit lines 32A extending over the bit line contacts 2', and concurrently leaving portions of the first conducting layer 32 in the capacitor node contact openings 2" to form node landing plug contacts 32B. In the peripheral areas 9 of the chip, layers 34 and 32 are patterned to form electrical landing plug contacts 32C to the substrate 10, while leaving portions of layers 34 and 32 over the openings to the patterned polycide layer (18 and 16) which result in landing plug contacts 32D, and provide electrical connections for the peripheral circuits. Since the bit lines 32A and the landing plug contacts 32B in the capacitor node contact openings 2" are formed at the same time and are self-aligned, the photolithographic alignment necessary for making separate contact openings is avoided and the critical dimensions (CD) are better controlled. The third photoresist mask 36 is then removed.

Still referring to FIG. 7, second sidewall spacers 38 are formed on the bit lines 32A having insulating layer 34 thereon. The sidewall spacers are formed by depositing a conformal $Si_3N_4$ layer using LPCVD and is deposited to a thickness of between about 200 and 800 Angstroms. The $Si_3N_4$ is then anisotropically etching back to form the sidewall spacers 38.

Figure 8:
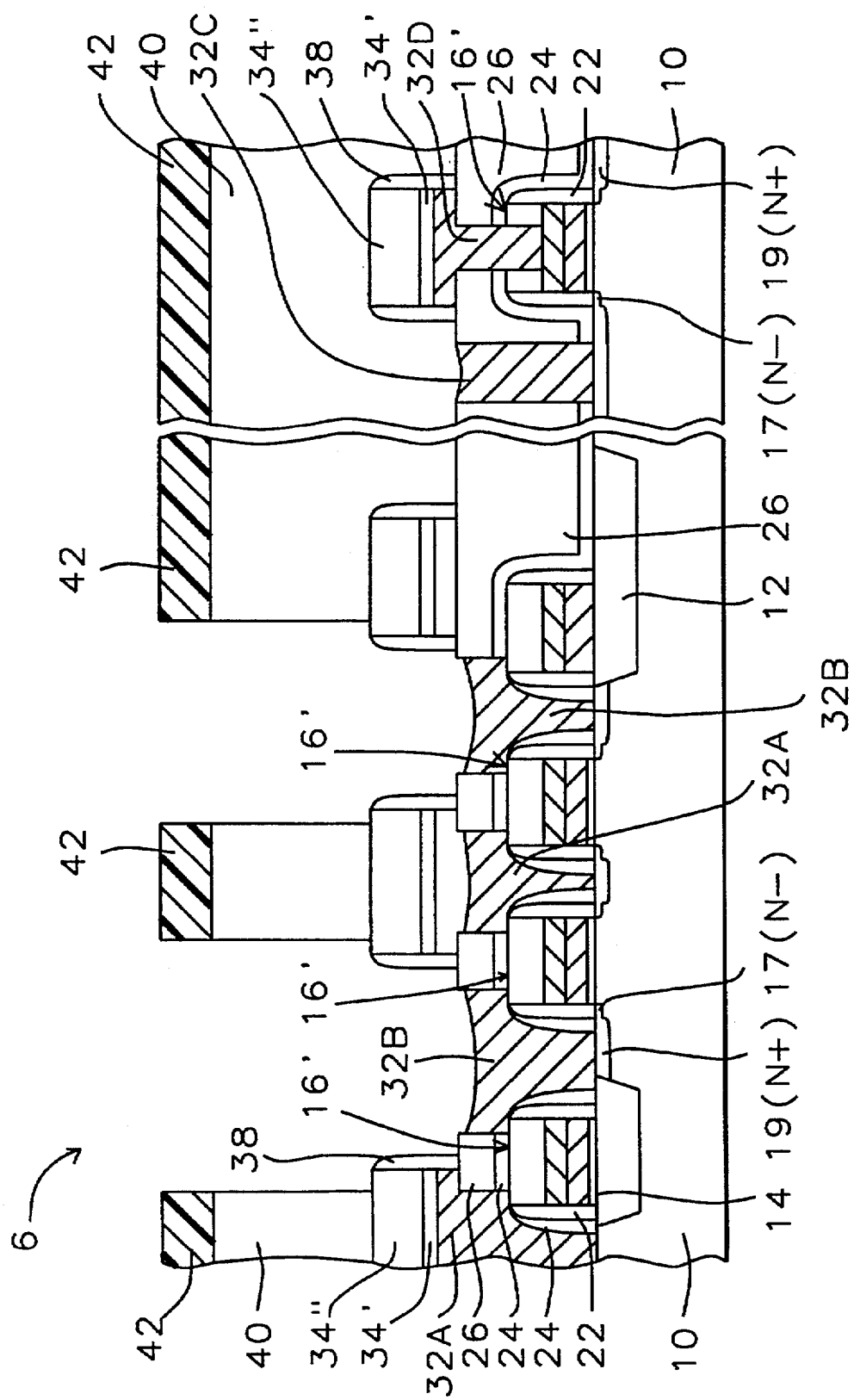

Referring to FIG. 8, the stacked storage capacitors are now formed by depositing a relatively thick fourth insulating layer 40, composed of $SiO_2$. Layer 40 is preferably deposited by LPCVD using TEOS or TEOS/ozone as the reactant gas mixture. Layer 40 is deposited to a preferred thickness of between about 9000 and 20000 Angstroms. A fourth photoresist mask 42 and anisotropic plasma etching are used to form openings 6 in layer 40 for the capacitor bottom electrodes aligned over and to the landing plugs contacts 32B used as the capacitor node contacts. The openings 6 are etched preferably using RIE and an etchant gas such as $C_4F_8$, $CHF_3$, $CH_3F$, $CF_4$, CO, $O_2$ and Ar as the carrier gas.

Figure 9:
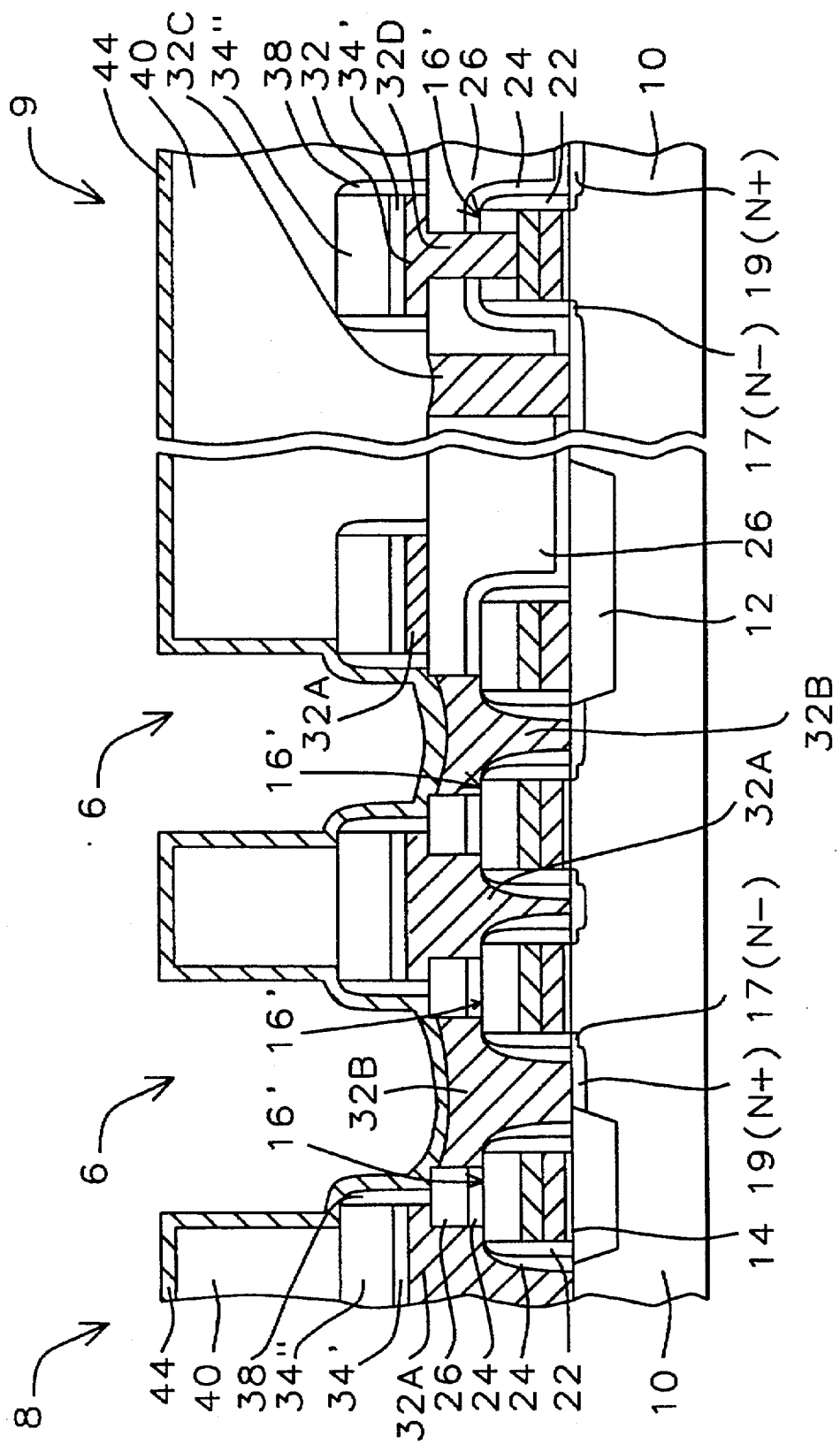

Referring now FIG. 9, the fourth photoresist mask 42 is removed by plasma ashing in $O_2$. A conformal second conducting layer 44 is deposited for forming the capacitor bottom electrodes. Layer 44 is composed of a conductively doped polysilicon layer. Preferably the polysilicon is deposited by LPCVD using, for example, silane ($SiH_4$) as the reactant gas, and is in-situ doped with phosphorus using a dopant gas such as phosphine ($PH_3$). The polysilicon layer 44 is doped to a concentration of between about 1.0 E 19 and 1.0 E 21 atoms/cm$^3$, and is deposited to a thickness of between about 300 and 1000 Angstroms. Alternatively, layer 44 can be a tungsten layer, deposited by LPCVD using $WF_6$ as the reactant gas. Layer 44 can also be other electrically conducting materials such as TiN, which can be deposited by CVD using $TiCl_4$ and $NH_3$ as the reactant gases.

Figure 10:
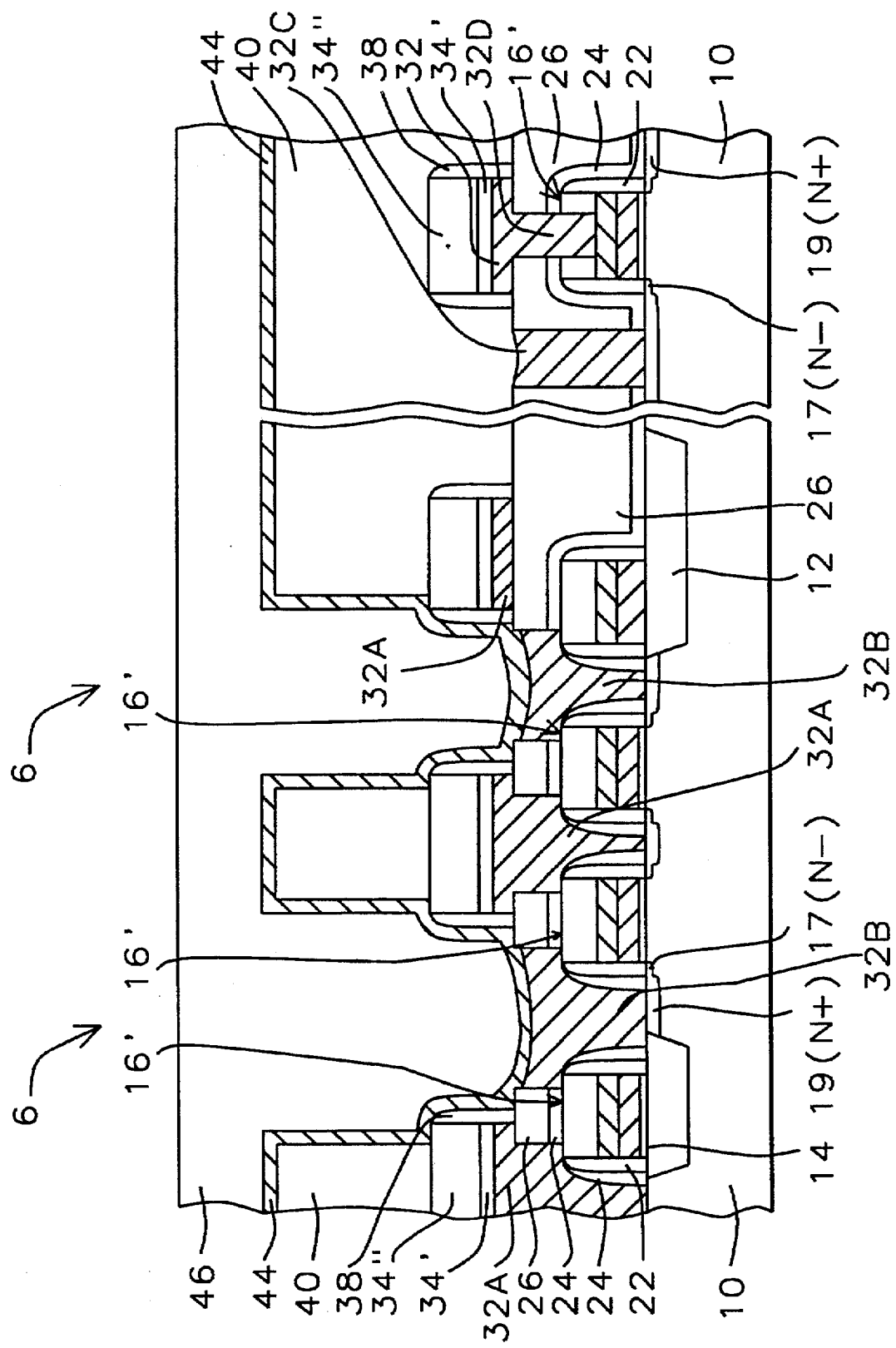

Referring to FIG. 10, a polymer 46 is deposited to fill the capacitor openings 6 and to form a planar surface. Various polymers that can be removed by $O_2$ plasma ashing can be used, including photoresist. Other polymers that can be used including polyimide. The polymer is planarized by liquid flow during spin coating.

Figure 11:
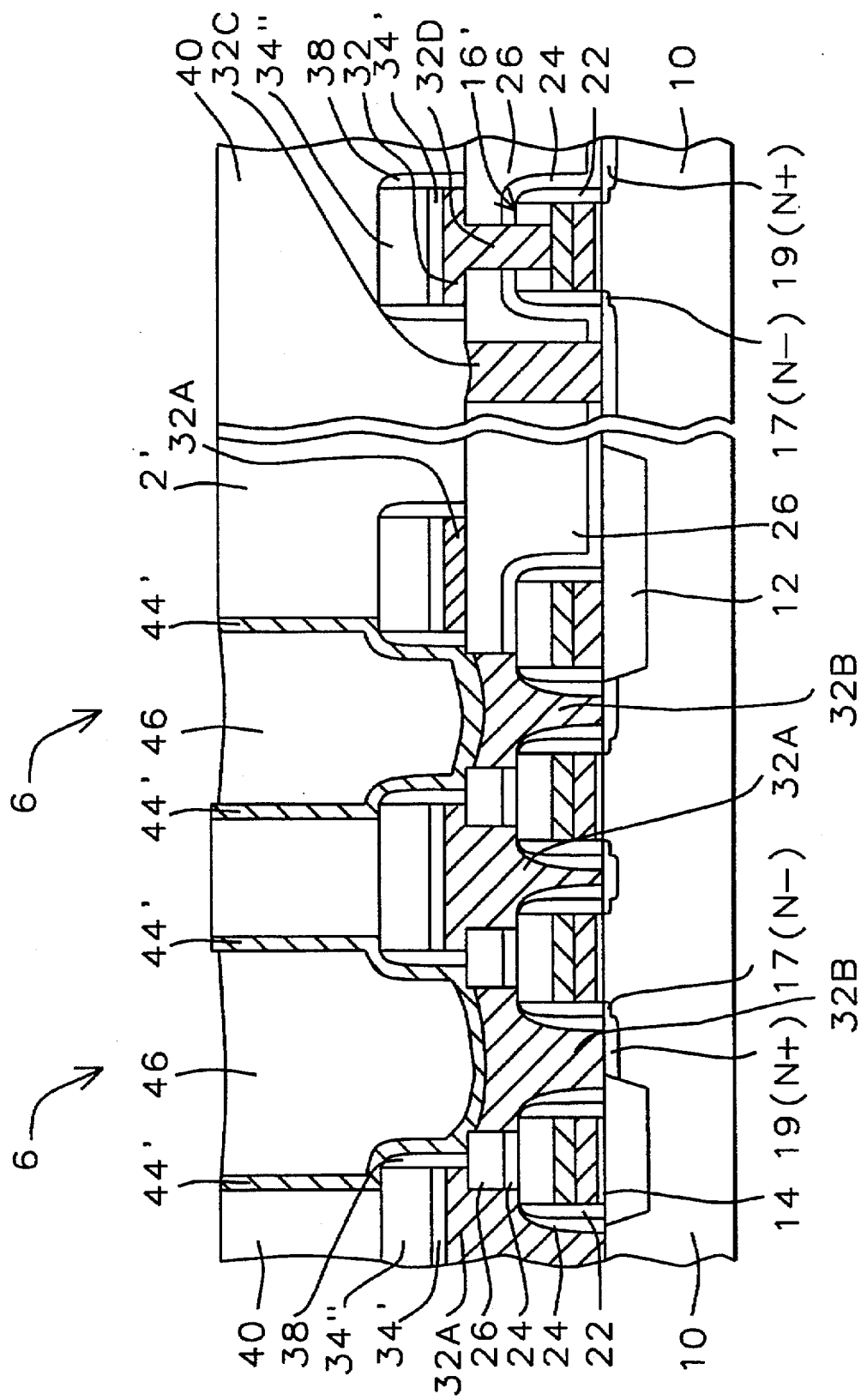

Referring next to FIG. 11, the polymer 46 is blanket etched back to the second conducting layer 44 on the top surface of the fourth insulating layer 40, while leaving portions in the capacitor openings 6 to protect the second conducting layer 44 in the openings for the bottom electrodes. The exposed second conducting layer 44 on the top surface of the fourth insulating layer 40 is etched back to complete the array of capacitor bottom electrodes 44' for the DRAM.

Figure 12:
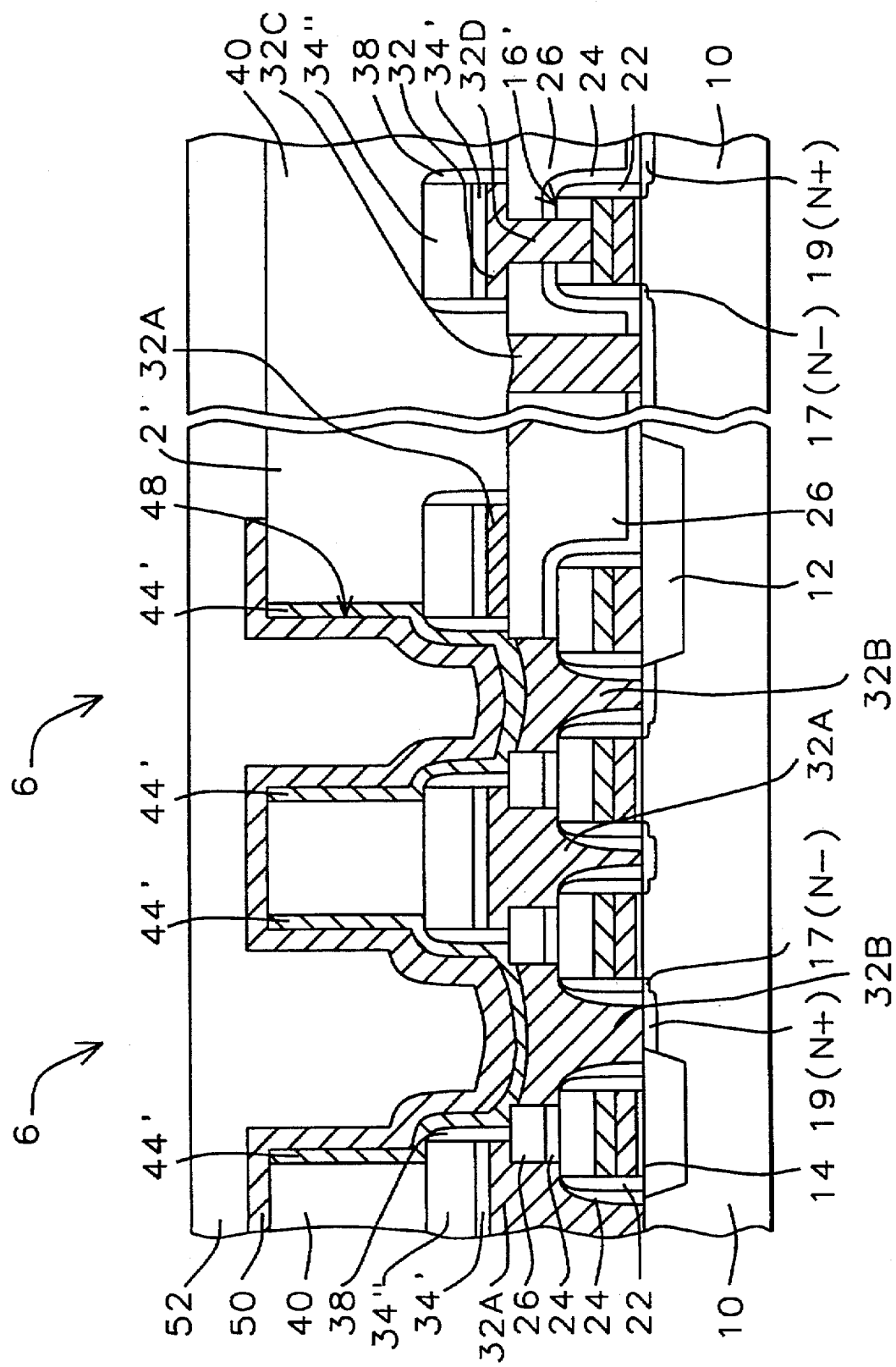

Referring to FIG. 12, the polymer 46 is then removed, for example by plasma ashing in $O_2$. A capacitor interelectrode dielectric layer 48 is then formed on the surface of the bottom electrodes 44', and is not depicted as a separate layer in the FIG. Preferably layer 48 is an insulator having a high dielectric constant. For example, if the bottom electrodes are composed of a doped polysilicon, then layer 48 can be a silicon oxide-silicon nitride-silicon oxide (ONO). Layer 48 can be formed by growing a thin $SiO_2$ layer, depositing a silicon nitride layer by LPCVD, and then converting the top surface of the nitride layer to a silicon oxide. Alternatively, when the bottom electrodes 44' are composed of tungsten or TiN, the interelectrode dielectric layer can be composed of a more exotic dielectric layer, such as tantalum pentoxide ($Ta_2O_5$) or barium strontium titanium oxide (BaSr)$TiO_3$, commonly referred to as BST. Preferably the thickness of layer 48 is between about 45 and 300 Angstroms.

Still referring to FIG. 12, the array of stacked capacitors is now completed by depositing a conformal third conducting layer 50, such as a doped polysilicon, TiN, or the like. Preferably layer 50 is deposited to a thickness of between about 500 and 1500 Angstroms. Layer 50 is then patterned to form the capacitor top electrodes 50. A fifth insulating layer 52 is deposited sufficiently thick to fill the capacitor openings 6 and more specifically to a thickness of between about 4000 and 10000 Angstroms. Layer 52 is then chemically/mechanically polished back to form a planar surface.

Figure 13:
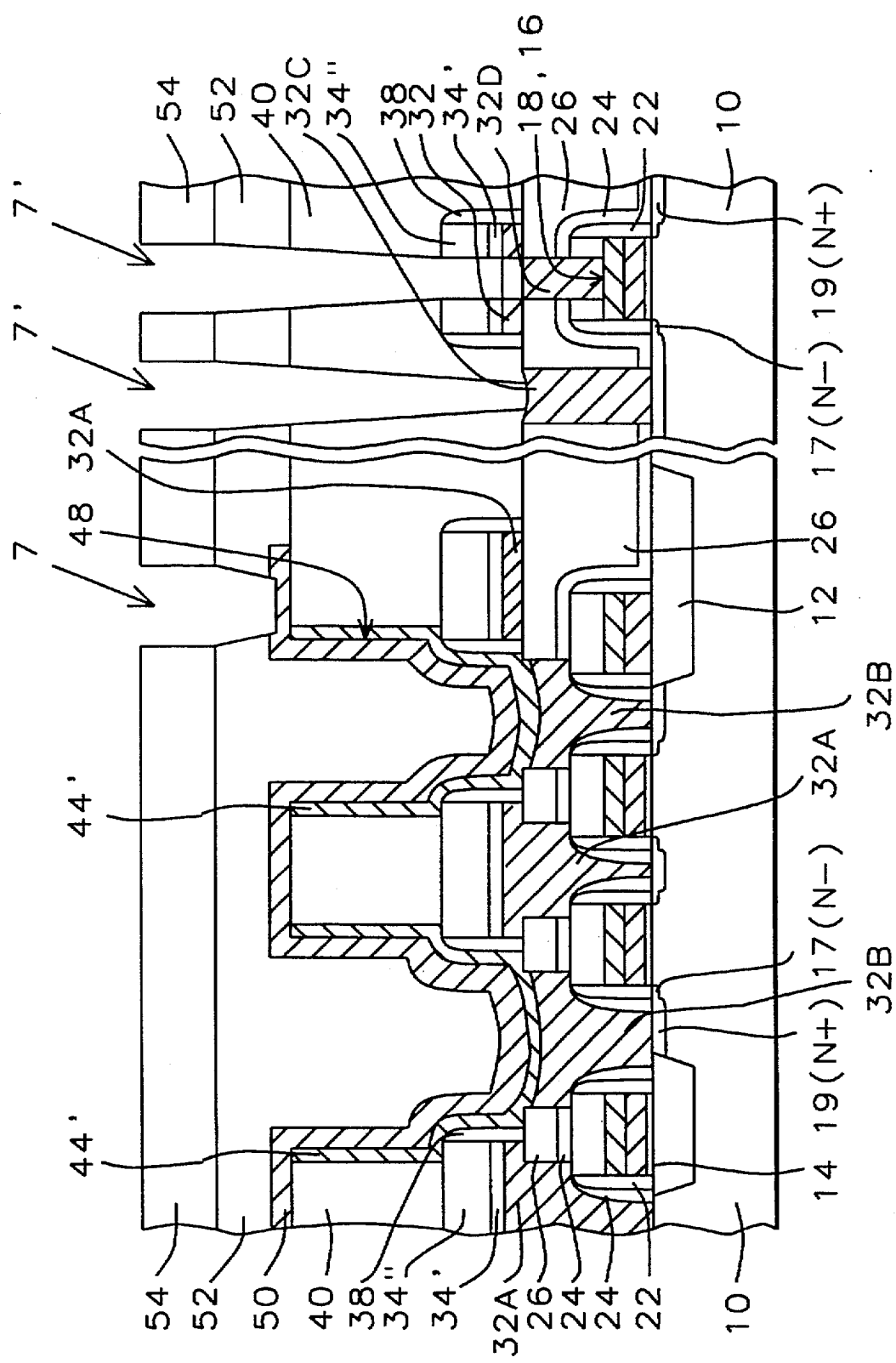

Referring to FIG. 13, a fifth photoresist mask 54 and anisotropic plasma etching are used to etch the contact openings 7 to the capacitor top electrodes 50, while concurrently etching multilevel contact openings 7' in the fifth and fourth insulating layers 52 and 40 to the electrical plug contacts (tungsten plugs) 32C on the substrate and to the patterned polycide layer (18,16) in the peripheral device area 9. The contacts are preferably etched using RIE and an etchant gas such as $C_4F_8$, $CHF_3$, $CH_3F$, $CF_4$, CO, $O_2$ and Ar as the carrier gas, which etches the BPSG and $SiO_2$ selectively to the conducting layer, such as the polysilicon top electrodes 50 and tungsten landing plugs 32C. By the method of this invention, the multilevel contact openings are etched to the electrical landing plug contacts resulting in shallower contact openings and reduced aspect ratios. This improves the reliability of making contacts on high-density circuits having submicron dimensions.

Figure 14:
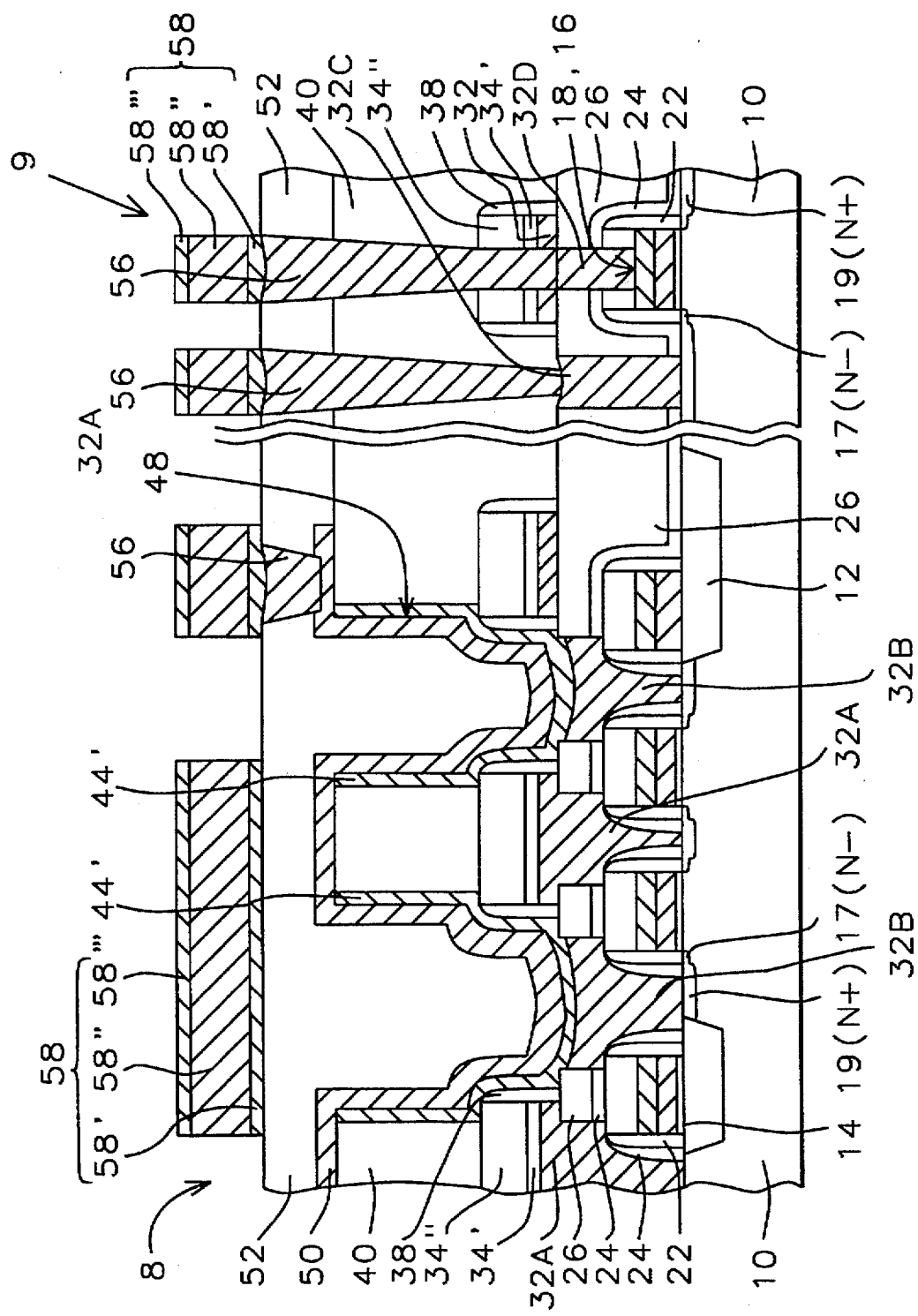

Referring now to FIG. 14, the fifth photoresist mask 54 is removed. A fourth conducting layer 56 is deposited and etched back to form the conducting plugs in the multilevel contact openings. Layer 56 is preferably formed by depositing a Ti/TiN barrier layer and a tungsten layer. The Ti/TiN barrier layer is preferably deposited by physical vapor deposition or CVD to a thickness of between about 200 and 800 Angstroms, and the tungsten is deposited by CVD using $WF_6$ to a thickness sufficient to fill the openings 7 and 7', and more specifically to a thickness of between about 2000 and 5000 Angstroms. Layer 56 is then etched back or chemically/mechanically polished back to form the conducting plugs 56 in the multilevel contact openings 7 and 7', having reduced aspect ratios.

The DRAM circuit is now completed to the first level of electrical interconnections by depositing a fifth conducting layer 58. Layer 58 is a multilayer, preferably composed of a barrier layer 58' such as Ti/TiN, a conducting layer 58" such as AlCu, and top layer 58'" such as TiN. Layer 58' is deposited by physical vapor deposition or CVD to a thickness of between about 400 and 1500 Angstroms. The AlCu layer 58" is deposited to a thickness of between about 4000 and 8000 Angstroms. The TiN layer 58''' is deposited to a thickness of between about 200 and 1500 Angstroms. The multilayer 58 is then patterned by conventional photolithography and plasma etching to form the next level of electrical interconnections.

Figure 15:
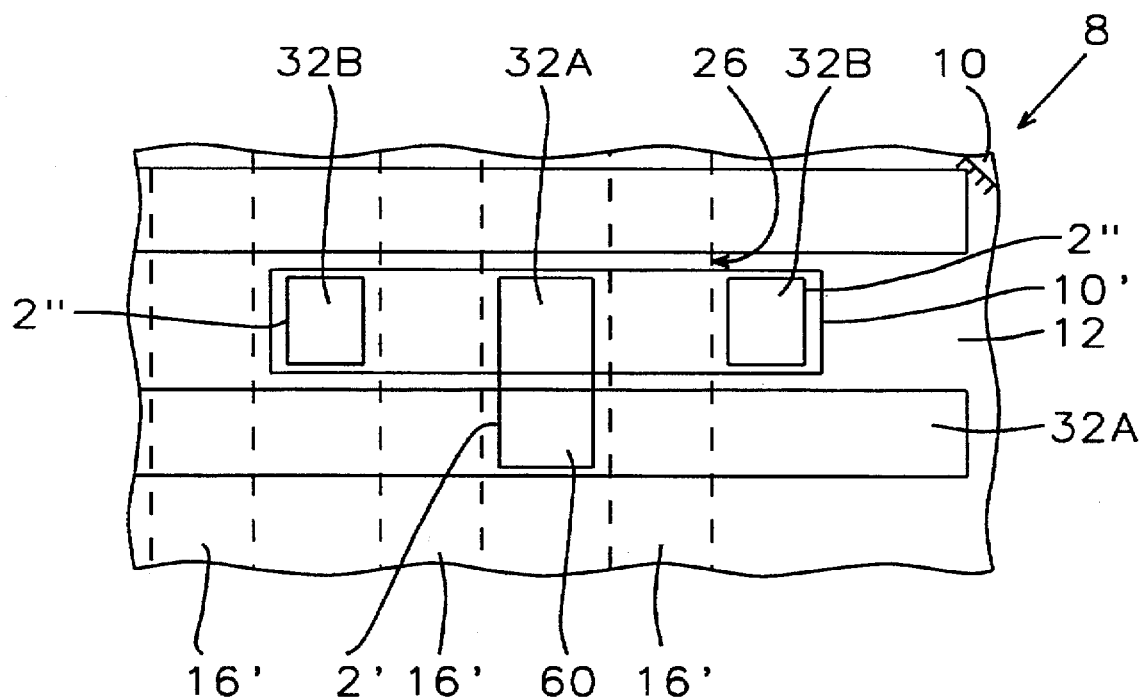
FIG. 15 is a schematic top view showing a portion of the memory cell area for a DRAM device by the method of this invention.

To better appreciate the invention, a schematic top view of one possible DRAM circuit layout is shown in FIG. 15 for the memory cell area 8. Only the pertinent elements are depicted in the top view. FIG. 15 shows the perimeter of the device area 10' on the substrate 10 surrounded by the field oxide area 12. The word lines 16' are formed extending over the device area 10' where they function as the FET gate electrodes, and are also labeled 16'. The contact openings 2' and 2'' are then etched in the insulating layer 26 to form the self-aligned common bit line contact opening 2' between the two word lines 16', and to concurrently etch the self-aligned capacitor node contact openings 2'', respectively. When the Ti-TiN/tungsten layer 32 is deposited and patterned to form the bit lines 32A, the tungsten is retained in the openings 2' to form the self-aligned landing plug contact 32A for the bit line, and the tungsten is also retained in openings 2'' to form the self-aligned landing plug contact 32B for the capacitor node contacts. The common bit line contact 32A is designed to make electrical contact to the bit line in the region 60.

While the invention has been particularly shown and described with reference to the preferred embodiment thereof, it will be understood by those skilled in the art that various changes in form and details may be made without departing from the spirit and scope of the invention.

What is claimed is:

1. A method for making a dynamic random access memory (DRAM) device comprising the steps of:

providing a semiconductor substrate having device areas for memory cells and for peripheral device areas surrounded and electrically isolated from each other by field oxide areas, and further providing field effect transistors having gate electrodes formed from a patterned polycide layer on said device areas, and said gate electrodes having insulating first sidewall spacers and source/drain contact areas adjacent to said gate electrodes in said device areas;

depositing a conformal first insulating layer composed of silicon nitride;

depositing a second insulating layer which is planarized;

using a first photoresist mask and selectively anisotropically etching contact openings in said second insulating layer to said first insulating layer over said source/drain contact areas of said memory cells while protecting said peripheral device areas from etching;

selectively etching said first insulating layer in said contact openings to said source/drain contact areas and thereby forming concurrently bit line contact openings and capacitor node contact openings self-aligned to said gate electrodes in said memory cell areas;

removing said first photoresist mask;

using a second photoresist mask and selectively anisotropically etching contact openings in said second and said first insulating layers to said substrate and to said patterned polycide layer in said peripheral device areas while said second photoresist mask protects said memory cells from etching;

removing said second photoresist mask;

depositing a first conducting layer on said substrate and in said contact openings and partially etching back;

depositing a third insulating layer on said first conducting layer;

using a third photoresist mask and anisotropically etching said third insulating layer and said first conducting layer to form bit lines over said bit line contact openings, and concurrently to form node landing plugs in said node contact openings of said memory cells, and further forming electrical plug contacts to said substrate and to said patterned polycide layer in said peripheral device areas;

removing said third photoresist mask;

forming second sidewall spacers on said bit lines by depositing a conformal silicon nitride layer and anisotropically etching back, and further, forming stacked capacitors by;

depositing a fourth insulating layer on said substrate;

using a fourth photoresist mask to selectively anisotropically etch capacitor openings for bottom electrodes for said capacitors aligned over and to said node landing plugs;

removing said fourth photoresist mask; depositing a conformal second conducting layer in said capacitor openings;

depositing a polymer to fill said capacitor openings and forming a planar surface;

blanket etching back said polymer to said second conducting layer on said fourth insulating layer and leaving portions in said capacitor openings, and etching back said second conducting layer to form said bottom electrodes;

removing said polymer;

depositing an interelectrode dielectric layer;

depositing and patterning a third conducting layer to form capacitor top electrodes;

depositing a fifth insulating layer sufficiently thick to fill said capacitor openings and polishing back to form a planar surface;

using a fifth photoresist mask and anisotropically and selectively etching multilevel contact openings in said fifth insulating layer to said capacitor top electrodes, while concurrently etching multilevel contact openings in said fifth and fourth insulating layers to said electrical plug contacts on said substrate and to said patterned polycide layer in said peripheral device areas, said multilevel contact openings etched to said electrical plug contacts resulting in reduced aspect ratios;

depositing and etching back a fourth conducting layer to form conducting plugs in said multilevel contact openings;

depositing and patterning a fifth conducting layer to form the next level of electrical interconnections.

2. The method of claim 1, wherein said first insulating layer is deposited to a thickness of between about 50 and 400 Angstroms.

3. The method of claim 1, wherein said second insulating layer, which is planarized, is a borophosphosilicate glass and has a thickness of between about 4500 and 9000 Angstroms over said gate gate electrodes.

4. The method of claim 1, wherein said first conducting layer consists of a metal barrier layer of titanium/titanium nitride deposited to a thickness of between about 150 and 800 Angstroms and a tungsten layer having a thickness of between about 500 and 2000 Angstroms after planarizing.

5. The method of claim 1, wherein said third insulating layer is composed of a silicon oxide layer having a thickness of between about 100 and 1000 Angstroms, and a top layer of silicon nitride having a thickness of between about 500 and 2500 Angstroms.

6. The method of claim 1, wherein said fourth insulating layer is silicon oxide deposited to a thickness of between about 9000 and 20000 Angstroms.

7. The method of claim 1, wherein said second conducting layer is a material selected from the group consisting of polysilicon, tungsten, and titanium nitride, and is deposited to a thickness of between about 300 and 1000 Angstroms.

8. The method of claim 1, wherein said polymer is etched back by plasma etching in oxygen.

9. The method of claim 1, wherein said interelectrode dielectric layer is a material selected from the group consisting of tantalum pentoxide and barium strontium titanium oxide $(BaSr)TiO_3$.

10. The method of claim 1, wherein said fifth insulating layer is silicon oxide deposited to a thickness of between about 4000 and 10000 Angstroms.

11. The method of claim 1, wherein said third insulating is silicon nitride deposited to a thickness of between about 100 and 1000 Angstroms.

12. The method of claim 1, wherein said fourth conducting layer consists of a metal barrier layer of titanium/titanium nitride deposited to a thickness of between about 200 and 800 Angstroms and a tungsten layer deposited to a thickness of between about 2000 and 5000 Angstroms.

13. The method of claim 1, wherein said fifth conducting layer is a multilayer consisting of titanium-titanium nitride aluminum copper-titanium nitride where said aluminum copper has a thickness of between about 4000 and 5000 Angstroms.

14. A method for making a dynamic random access memory (DRAM) device comprising the steps of:

providing a semiconductor substrate having device areas for memory cells and for peripheral device areas surrounded and electrically isolated from each other by field oxide areas, and further providing field effect transistors having gate electrodes formed from a patterned polycide layer on said device areas, and said gate electrodes having insulating first sidewall spacers and source/drain contact areas adjacent to said gate electrodes in said device areas;

depositing a conformal first insulating layer composed of silicon nitride;

depositing a second insulating layer which is planarized;

using a first photoresist mask and selectively anisotropically etching contact openings in said second insulating layer to said first insulating layer over said source/drain contact areas of said memory cells while protecting said peripheral device areas from etching;

selectively etching said first insulating layer in said contact openings to said source/drain contact areas and thereby forming concurrently bit line contact openings and capacitor node contact openings self-aligned to said gate electrodes in said memory cell areas;

removing said first photoresist mask;

using a second photoresist mask and selectively anisotropically etching contact openings in said second and said first insulating layers to said substrate and to said patterned polycide layer in said peripheral device areas while said second photoresist mask protects said memory cells areas from etching;

removing said second photoresist mask;

depositing a first conducting layer composed of a barrier layer of titanium/titanium nitride and a tungsten layer on said substrate and in said contact openings and partially etching back;

depositing a third insulating layer on said first conducting layer;

using a third photoresist mask and anisotropically etching said third insulating layer and said first conducting layer to form bit lines over said bit line contact openings, and concurrently to form node landing plugs in said node contact openings of said memory cells, and further forming electrical plug contacts to said substrate and to said patterned polycide layer in said peripheral device areas;

removing said third photoresist mask;

forming second sidewall spacers on said bit lines by depositing a conformal silicon nitride layer and anisotropically etching back, and further, forming stacked capacitors by;

depositing a fourth insulating layer on said substrate;

using a fourth photoresist mask to selectively anisotropically etch capacitor openings for bottom electrodes for said capacitors aligned over and to said node landing plugs;

removing said fourth photoresist mask;

depositing a conformal second conducting layer in said capacitor openings;

depositing a polymer to fill said capacitor openings and forming a planar surface;

blanket etching back said polymer to said second conducting layer on said fourth insulating layer and leaving portions in said capacitor openings, and etching back said second conducting layer to form said bottom electrodes;

removing said polymer;

depositing an interelectrode dielectric layer;

depositing and patterning a third conducting layer to form capacitor top electrodes;

depositing a fifth insulating layer sufficiently thick to fill said capacitor openings and polishing back to form a planar surface;

using a fifth photoresist mask and anisotropically and selectively etching multilevel contact openings in said fifth insulating layer to said capacitor top electrodes, while concurrently etching multilevel contact openings in said fifth and fourth insulating layers to said electrical plug contacts on said substrate and to said patterned polycide layer in said peripheral device areas, said multilevel contact openings etched to said electrical plug contacts resulting in reduced aspect ratios;

depositing and etching back a fourth conducting layer to form conducting plugs in said multilevel contact openings, said fourth conducting layer consisting of a metal barrier layer of titanium/titanium nitride and a tungsten layer;

depositing and patterning a fifth conducting layer to form the next level of electrical interconnections.

15. The method of claim 14, wherein said first insulating layer is deposited to a thickness of between about 50 and 400 Angstroms.

16. The method of claim 14, wherein said second insulating layer, which is planarized, is a borophosphosilicate glass and has a thickness of between about 4500 and 9000 Angstroms over said gate electrodes.

17. The method of claim 14, wherein said titanium/titanium nitride barrier layer of said first conducting layer is deposited to a thickness of between about 150 and 800 Angstroms and said tungsten layer has a thickness of between about 500 and 2000 Angstroms after planarizing.

18. The method of claim 14, wherein said third insulating layer is composed of a silicon oxide layer having a thickness of between about 100 and 1000 Angstroms, and a top layer of silicon nitride having a thickness of between about 500 and 2500 Angstroms.

19. The method of claim 14, wherein said fourth insulating layer is silicon oxide deposited to a thickness of between about 9000 and 20000 Angstroms.

20. The method of claim 14, wherein said second conducting layer is a material selected from the group consisting of polysilicon, tungsten, and titanium nitride, and is deposited to a thickness of between about 300 and 1000 Angstroms.

21. The method of claim 14, wherein said polymer is etched back by plasma etching in oxygen.

22. The method of claim 14, wherein said interelectrode dielectric layer is a material selected from the group consisting of tantalum pentoxide and barium strontium titanium oxide $(BaSr)TiO_3$.

23. The method of claim 14, wherein said fifth insulating layer is silicon oxide deposited to a thickness of between about 4000 and 10000 Angstroms.

24. The method of claim 14, wherein said third insulating is silicon nitride deposited to a thickness of between about 100 and 1000 Angstroms.

25. The method of claim 14, wherein said titanium/titanium nitride barrier layer of said fourth conducting layer is deposited to a thickness of between about 200 and 800 Angstroms and said tungsten layer is deposited to a thickness of between about 2000 and 5000 Angstroms.

26. The method of claim 14, wherein said fifth conducting layer is a multilayer consisting of titanium-titanium nitride aluminum copper-titanium nitride where said aluminum copper has a thickness of between about 4000 and 8000 Angstroms.

* * * * *